(12) United States Patent
Kirk

(10) Patent No.: US 8,216,001 B2
(45) Date of Patent: Jul. 10, 2012

(54) CONNECTOR ASSEMBLY HAVING ADJACENT DIFFERENTIAL SIGNAL PAIRS OFFSET OR OF DIFFERENT POLARITY

(75) Inventor: Brian Peter Kirk, Amherst, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 12/938,965

(22) Filed: Nov. 3, 2010

(65) Prior Publication Data
US 2011/0189868 A1 Aug. 4, 2011

Related U.S. Application Data

(60) Provisional application No. 61/300,387, filed on Feb. 1, 2010.

(51) Int. Cl.
*H01R 24/00* (2011.01)
(52) U.S. Cl. ....................................................... 439/676
(58) Field of Classification Search .................. 439/676, 439/74, 79, 65, 108
See application file for complete search history.

(56) References Cited

U.S. PATENT DOCUMENTS

| | | |
|---|---|---|
| 6,350,134 B1 | 2/2002 | Fogg et al. |
| 6,394,822 B1 | 5/2002 | McNamara |
| 6,652,318 B1 | 11/2003 | Winings et al. |
| 6,692,272 B2 | 2/2004 | Lemke et al. |
| 6,872,085 B1 | 3/2005 | Cohen et al. |
| 6,976,886 B2 | 12/2005 | Winings et al. |
| 6,981,883 B2 | 1/2006 | Raistrick et al. |
| 6,994,569 B2 | 2/2006 | Minich et al. |
| 7,114,964 B2 | 10/2006 | Winings et al. |
| 7,229,318 B2 | 6/2007 | Winings et al. |
| 7,309,239 B2 | 12/2007 | Shuey et al. |
| 7,341,493 B2 | 3/2008 | Pepe et al. |
| 7,581,990 B2 * | 9/2009 | Kirk et al. ................ 439/607.05 |
| 7,607,951 B2 * | 10/2009 | Kirk ............................ 439/676 |
| 7,887,379 B2 * | 2/2011 | Kirk ............................ 439/676 |
| 2005/0170700 A1 | 8/2005 | Shuey et al. |
| 2006/0067067 A1 | 3/2006 | Heard |

(Continued)

OTHER PUBLICATIONS

D. Brooks, Crosstalk, Part 1 Understanding Forward v. Backward, UltraCAD Design, Inc., pp. 1-4, Nov. 2003, Mentor Graphics, www.mentor.com.

(Continued)

*Primary Examiner* — Chandrika Prasad
(74) *Attorney, Agent, or Firm* — Blank Rome LLP

(57) ABSTRACT

A connector for connecting a first printed circuit board with a second printed circuit board that comprises a first column of differential signal pair launches offset from a second column of differential signal pair launches on the first printed circuit board so that each differential signal pair in the first column is closest to a launch of a first polarity in a corresponding differential signal pair in the second column on the first circuit board, a first column of differential signal pair launches offset from a second column of differential signal pair launches on the second printed circuit board so that each differential signal pair in the first column is closest to a launch of a second polarity, opposite the first polarity, in a corresponding signal pair in the second column on the second circuit board, and a connector electrically connecting the first column of differential signal pair launches on the first printed circuit board to the first column of differential signal pair launches on the second printed circuit board and electrically connecting the second column of differential signal pair launches on the first printed circuit board to the second column of differential signal pair launches on the second printed circuit board.

23 Claims, 7 Drawing Sheets

U.S. PATENT DOCUMENTS

| | | | |
|---|---|---|---|
| 2006/0073709 A1 | 4/2006 | Reid | |
| 2007/0004282 A1* | 1/2007 | Cohen et al. | 439/608 |
| 2008/0246555 A1* | 10/2008 | Kirk et al. | 333/125 |
| 2008/0248658 A1* | 10/2008 | Cohen et al. | 439/55 |
| 2011/0230095 A1* | 9/2011 | Atkinson et al. | 439/607.06 |

OTHER PUBLICATIONS

European Search Report with Written Opinion for EP 11152531 dated May 27, 2011.

* cited by examiner

CONNECTOR ASSEMBLY HAVING ADJACENT DIFFERENTIAL SIGNAL PAIRS OFFSET OR OF DIFFERENT POLARITY

CROSS-REFERENCE TO RELATED APPLICATION

The present patent application claims the benefit of U.S. Provisional Application Ser. No. 61/300,387, filed Feb. 1, 2010, and is related to U.S. Pat. No. 7,607,951, filed Jan. 16, 2009, the entire disclosures of which are incorporated herein by reference.

BACKGROUND OF THE INVENTION

1. Field of the Invention

The present invention relates to a system for reducing noise in a backplane system. More particularly, the present invention reverses pin connections between backplanes to reduce crosstalk generated between pin connections in the backplanes.

2. Background of the Related Art

Electronic systems are often assembled from multiple printed circuit boards (PCBs). PCBs that contain electronic components are sometimes called "daughter cards." Often, electrical signals are routed from one daughter card to another through a PCB called a "backplane." A backplane includes conducting paths called "signal traces," or just "traces," etched onto the PCB using a conductive material, such as copper. Connectors are mounted on the backplane to make connections to the traces. The portion of a printed circuit board that allows a trace to be connected to a contact element in a connector or other electronic element is called a "signal launch," or just "launch." When connectors are used to mate daughter cards with the launches on a backplane, signal paths are established between the daughter cards via the signal traces on the backplane.

As electronic systems have become smaller, faster, and more complex, backplanes generally have been required to provide more signal traces without increasing in size, or while actually decreasing in size. As a result of the increased density of traces, electrical noise between signals has become more problematic. Electrical noise is usually considered any undesirable electrical energy in an electronic system, including but not limited to reflections, electromagnetic interference, mode conversions, and unwanted coupling, such as crosstalk.

The trend toward smaller, faster, and more complex electronic systems has also required daughter cards, backplanes, and their connectors to carry more and faster data signals in a smaller space without degrading the characteristics of those signals. Daughter cards, backplanes, and their connectors can be made to carry more signals in less space by placing signal conductors closer together. A major difficulty with placing signal conductors closer together is that electrical noise between the signal conductors increases as the distance between signal conductors decreases and as the speed of the signals increases. In addition, as frequency content increases, there is a greater possibility of energy loss. Energy loss may be attributed to impedance discontinuities, mode conversion, leakage from imperfect shielding, or undesired coupling to other signal conductors, such as crosstalk.

Differential signals are signals represented by a pair of conducting paths, called a "differential signal pair." The voltage difference between the conductive paths represents the signal. In general, the two conducing paths of a differential signal pair are arranged to run near each other. If any other source of electrical noise is electromagnetically coupled to the differential signal pair, the effect on each conducting path of the pair should be similar. Because the signal on the differential signal pair is treated as the difference between the voltages on the two conducting paths of the pair, a common noise voltage that is coupled to both conducting paths in the differential signal pair does not affect the signal. That renders a differential signal pair less sensitive to crosstalk noise, as compared with a single-ended signal path. At high speeds, the available conducting paths may encounter crosstalk, impedance, and attenuation mismatch characteristics, and the signal transmission characteristics may degrade.

Crosstalk generally refers to electromagnetic interference that comes from an adjacent wire. Current that flows down one of the traces, referred to as the "aggressor line," couples into the adjacent trace, called the "victim line," and creates two different noise signals in the victim line. One of the noise signals, called "forward crosstalk" or "far end crosstalk," flows in the victim line in the same direction as the current flowing in the aggressor line. The other noise signal, called "backward crosstalk," flows in the victim line in the opposite or backward direction as the current flowing in the aggressor line.

Referring to FIG. 1(a), a standard backplane connection system 100 is shown having a first connector 110, a second connector 120, and various trace pairs 130-140. The first connector 110 is connected to input trace pairs 130 and 132 on a first daughter card. Trace pairs 134 and 136 are provided on a backplane to connect the first connector 110 to the second connector 120. And, the second connector 120 is connected to output trace pairs 138 and 140 on a second daughter card. In a backplane environment, the input trace pairs 130 and 132 coming into the first connector 110 can be, for example, from a line card of a router or a processor card on the first daughter card, and the output trace pairs 138 and 140 going out from the second connector 120 can be, for example, to a fabric card or a switch card on the second daughter card.

The impact of crosstalk on the system 100 is exemplified in FIGS. 1(b)-(i). In the system 100 of FIG. 1(a), the bottom trace pairs 130, 134, and 138 are the aggressor trace pairs and the top trace pairs 132, 136, and 140 are the victim trace pairs. After the signal on the aggressor trace pair 130 reaches the first connector 110, as shown in FIG. 1(b), noise in the form of crosstalk is created at the first connector 110, as shown in FIG. 1(c). That noise is generated inside the first connector 110 by coupling between the differential signal pairs.

Noise is also generated in the portion of the backplane that the first connector 110 is pressed into, which is called the "footprint" of the first connector 110. The footprints of the first and second connectors 110 and 120 each have mechanisms for mating the contact elements of the first and second connectors 110 and 120 to their respective launches in the backplane, such as surface-mount or compliant pin attachments. The vias created in the substrate of the backplane to make those attachments are comprised of cylinders extending through the thickness of the board. Those via cylinders can also couple to each other and generate noise. That effect is directly related to the thickness of the board, such that the thicker the board is, the more crosstalk that is generated. For a thick board, the crosstalk in the backplane can be greater than the crosstalk from the connector. Noise may be generated in a similar manner in the daughter card backplanes.

There is no noise on the second connector 120 at this point, as shown in FIG. 1(d), so that the noise at the first connector 110 is the total noise for the system 100, as shown in FIG. 1(e). The noise from the first connector 110 continues at the output of the first connector 110 on the victim trace pair 136.

When the signal reaches the second connector 120, as shown in FIG. 1(*f*), there is noise on the victim trace 136 from the first connector 110, as shown in FIG. 1(*g*), in addition to the noise that is generated at the second connector 120, as shown in FIG. 1(*h*). The noise generated in the second connector 120 is substantially the same as the noise generated in the first connector 110, i.e., noise from the coupling between pairs, the footprint attachments, and the via cylinder coupling. The noise on the victim trace pair 136 and the noise on the second connector 120 get combined inside the second connector 120. Thus, the total noise in the system 100, as shown in FIG. 1(*i*), is approximately double that at each connector 110 and 120, as shown in FIGS. 1(*g*) and (*h*), respectively.

While it is possible to minimize those deleterious coupling effects by adding space between the victim and aggressor lines, that comes at the disadvantage of losing density in the backplane and the connector. Thus, as more and more signals are populated onto backplanes and more and more signal conductors are provided in connectors, the problem with coupling becomes more probable and more problematic. Accordingly, there is a need for a system that reduces noise generated at the connector footprints and connectors of a connection system. Moreover, there is a need for a connection system that allows connectors that increase speed and density without degrading the electrical characteristics of the signals they route.

SUMMARY OF THE INVENTION

In accordance with those and other objectives, a connection system is provided that includes a connector for connecting a first printed circuit board with a second printed circuit board, the connector comprising a first column of differential signal pair launches offset from a second column of differential signal pair launches on the first printed circuit board so that each differential signal pair in the first column is closest to a launch of a first polarity in a corresponding differential signal pair in the second column on the first circuit board, a first column of differential signal pair launches offset from a second column of differential signal pair launches on the second printed circuit board so that each differential signal pair in the first column is closest to a launch of a second polarity, opposite the first polarity, in a corresponding signal pair in the second column on the second circuit board, and a connector electrically connecting the first column of differential signal pair launches on the first printed circuit board to the first column of differential signal pair launches on the second printed circuit board and electrically connecting the second column of differential signal pair launches on the first printed circuit board to the second column of differential signal pair launches on the second printed circuit board. Those and other objects of the invention, as well as many of the intended advantages thereof, will become more readily apparent when reference is made to the following description, taken in conjunction with the accompanying drawings.

DETAILED DESCRIPTION OF THE PREFERRED EMBODIMENTS

Figure 1:
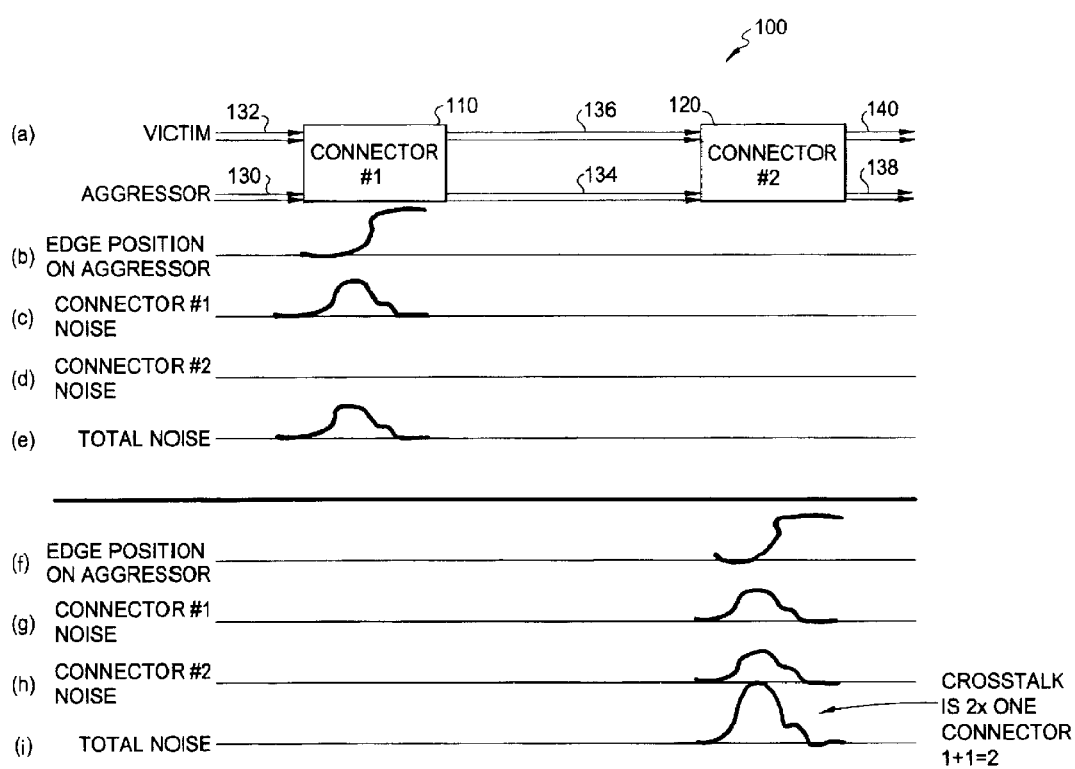
FIGS. 1(*a*)-(*i*) illustrate a schematic view of a conventional backplane connection system and graphs of the crosstalk generated in that system.

In describing the preferred embodiments of the invention illustrated in the drawings, specific terminology will be resorted to for the sake of clarity. However, the invention is not intended to be limited to the specific terms so selected, and it is to be understood that each specific term includes all technical equivalents that operate in a similar manner to accomplish a similar purpose.

Figure 2:
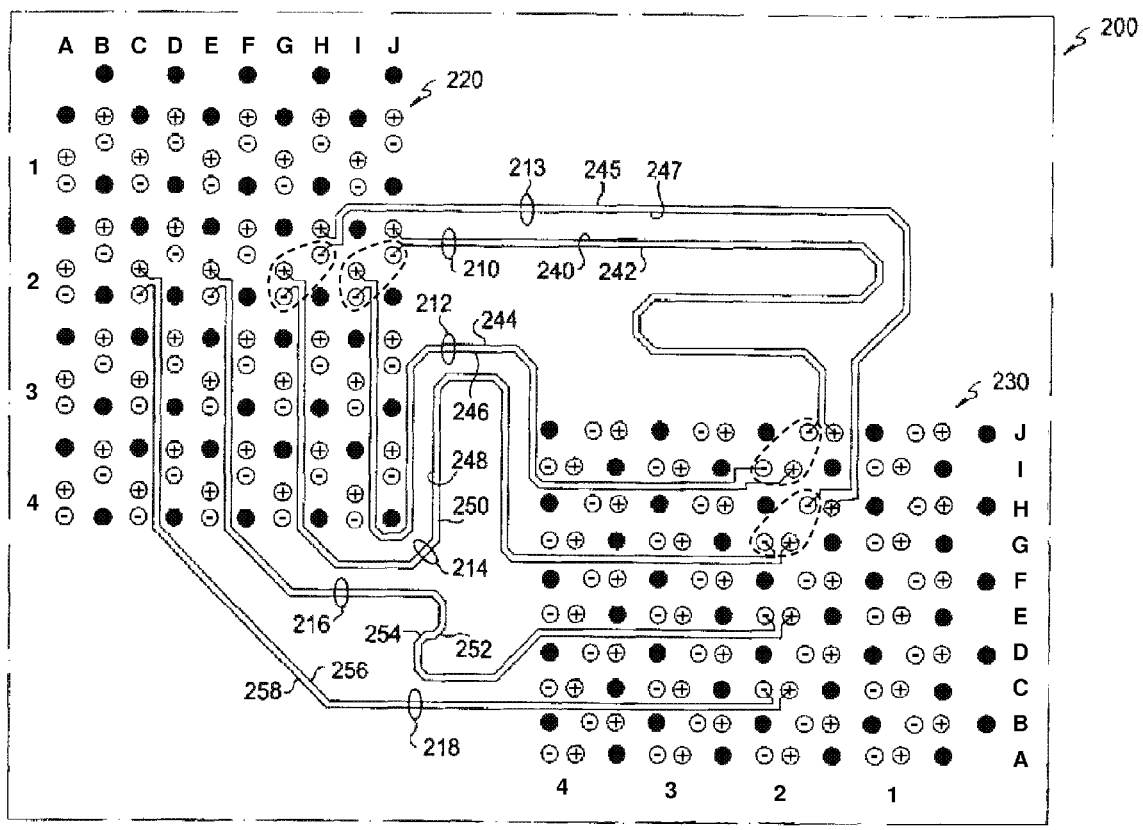
FIG. 2 illustrates a plan view of a backplane with P-N reversal of traces in accordance with a non-limiting embodiment of the present invention.

Turning to the drawings, FIG. 2 shows a backplane 200 having a first footprint 220 and a second footprint 230 in accordance with a non-limiting embodiment of the present invention. The first footprint 220 and the second footprint 230 each have a plurality of signal launches, shown in FIG. 2 as an array of ten columns (A-J) each having four rows (1-4) of differential signal pairs. Each differential signal pair includes a launch that carries the positive "+" signal (P) of the differential signal pair and a launch that carries the negative "−" signal (N) of the differential signal pair. The launches between the differential signal pairs are ground connections, shown in FIG. 2 as blacked-out launches. The ground connection is provided between each differential signal pair. The launches for each differential signal pair are located closer to each other than to neighboring differential signal pairs. That closeness permits better coupling within the differential signal pairs while reducing crosstalk from adjacent signal pairs.

The differential signal pair launches have corresponding differential signal trace pairs. Five differential signal trace pairs 210-218 are shown connecting the launches in row 2 of the first footprint 220 to corresponding launches in row 2 of the second footprint 230. Each differential signal pair 210-218 has a pair of corresponding signal traces 240-258. Although only differential signal trace pairs 210-218 are show for clarity, each differential signal pair in each row of the first footprint 220 may be connected to each corresponding differential signal pair in each corresponding row of the second footprint 230 in a substantially similar manner. In addition, although the connections between the first and second footprints 220 and 230 are illustrated as implemented on a backplane 200, any suitable implementation can be made, such as on a midplane or a daughter card.

The first differential signal trace pair 210 includes traces 240 and 242 that extend between the first footprint 220 and the second footprint 230. The first trace 240 connects at the positive "+" launch found in row 2, column J of the first and second footprints 220 and 230, and the second trace 242 connects at the negative "−" launch found in row 2, column J of the first and second footprints 220 and 230. Thus, the first trace 240 connects from a positive "+" launch to a positive launch "+", or P-P, and the second trace 242 connects from a negative "−" launch to a negative launch "−", or N-N. That direct P to P and N to N mapping from one launch to another is the way connectors are conventionally connected to each other on a backplane and is generally referred to herein as a "straight connection."

In the present invention, that straight connection is utilized for every other differential signal trace pair extending between the first and second footprints 220 and 230 of the backplane 200, such as for the third differential signal trace pair 213. However, every other differential signal trace pair 212, 214, 216, and 218 between the straight connections has a reverse connection, whereby the connections of its traces are reversed. For example, the differential signal trace pair 212 has two traces 244 and 246. The first trace 244 connects at the positive "+" launch found in row 2, column I of the first footprint 220, while the other end of the first trace 244 connects at the negative "−" launch in row 2, column I of the second footprint 230. And, the second trace 246 connects at the negative "−" launch in row 2, column I of the first footprint 220, while the other end of the second trace 246 connects at the positive "+" launch in row 2, column I of the second footprint 230. Thus, the first trace 244 connects from a positive "+" launch of the first footprint 220 to a negative "−" launch of the second footprint 230, or P-N, and the second trace 246 connects from a negative "−" launch of the first footprint 220 to positive launch "+" of the second footprint, or N-P. Connecting the launches in that reverse fashion is referred to herein generally as a "reverse connection." The connections of the traces are able to be reversed because the signal on each trace of the differential signal pairs is immaterial. It is the voltage difference on those pairs that is measured and not the signal on any one trace.

A trace that has a straight connection has the same polarity at both ends because it extends from a launch of one polarity in the first footprint 220 to a launch in the second footprint 230 with the same polarity, i.e., P-P or N-N. By contrast, a trace that has a reverse connection has opposite polarity connections at its ends because it extends from a positive "+" launch in the first footprint 220 to a negative launch "−" in the second footprint 230, and vice versa, i.e., P-N and N-P. And, by using a reverse connection for every other differential signal trace pair on the backplane 200, the forward crosstalk pulse generated in a connector at the second footprint 230 is the opposite polarity to the crosstalk pulse generated in a connector at the first footprint 220. Accordingly, the crosstalk generated in the connector attached at the first footprint 220 is cancelled by the crosstalk generated in the connector attached at the second footprint 230.

Figure 3:
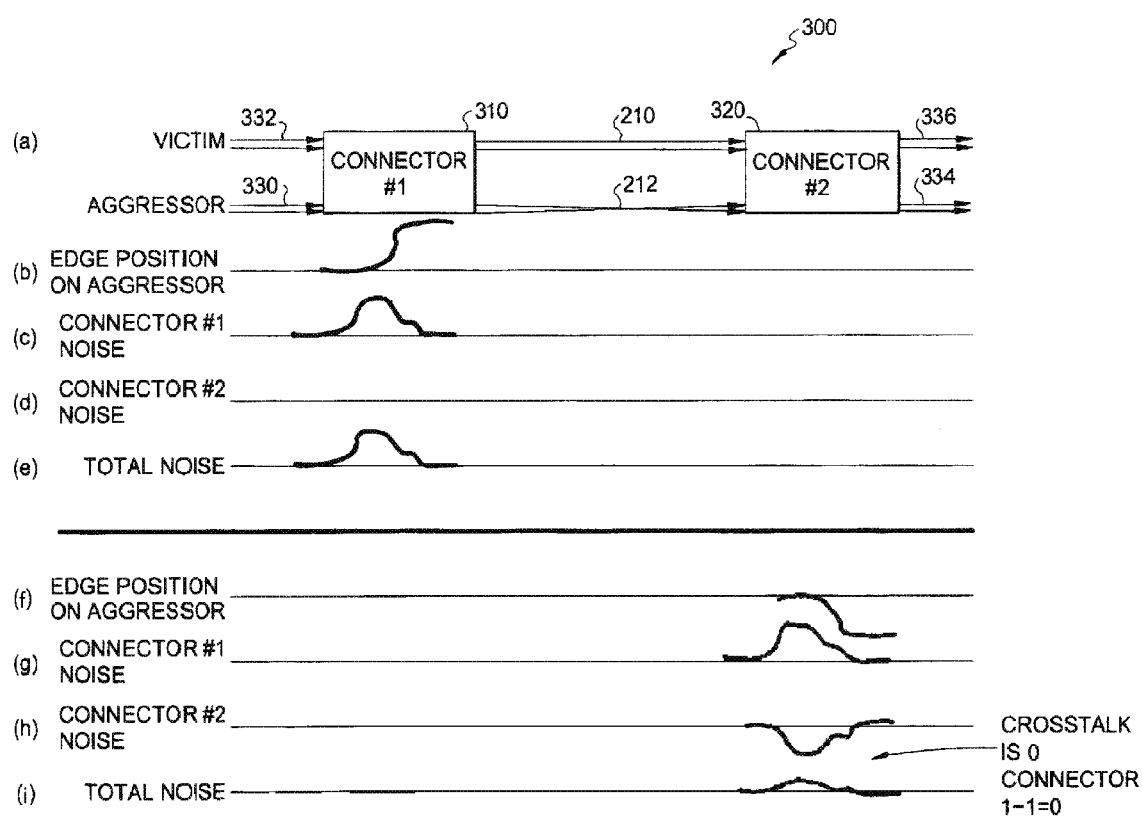
FIGS. 3(*a*)-(*i*) illustrate a schematic view of a backplane connection system according to a non-limiting embodiment of the present invention and graphs of the crosstalk generated in that system.

Referring to FIG. 3(a), a backplane connection system 300 is shown that incorporates the backplane of FIG. 2. The system has a first connector 310, a second connector 320, and various differential signal trace pairs 210, 212, and 330-336. The first connector 310 is connected to input trace pairs 330 and 332 on a first daughter card. The second connector is connected to output trace pairs 334 and 336 on a second daughter card. And, because the system 300 illustrated in FIG. 3(a) employs the trace configuration of FIG. 2, traces 210 and 212 are provided on the backplane 200 to connect the first connector 310 to the second connector 320, with trace pair 210 including traces 240 and 242 in a straight connection and trace pair 212 including traces 244 and 246 in a reverse connection. As with the system 100 of FIG. 1(a), the bottom trace pairs 330, 212, and 334 are the aggressor trace pairs and the top trace pairs 332, 210, and 336 are the victim trace pairs.

Also as with FIG. 1, noise is created at the first connector 310, as shown in FIGS. 3(b) and 3(c), due to the crosstalk on the victim trace pair 332 from the aggressor trace pair 330. At that point, the signal has not reached the second connector 320, as shown in FIG. 3(d), so the total noise in the system 300 is due to the noise at the first connector 310, as shown FIG. 3(e). Turning to FIG. 3(f), the signal on the aggressor trace pair 212 has now reached the second connector 320. Since the aggressor trace pair 212 is reversed, the aggressor signal out from the first connector 310 has an inverse polarity with respect to the aggressor signal on the aggressor trace pair 330 into the first connector 310. In the illustrated example, the noise from the first connector 310 is positive, as shown in FIG. 3(c), and the noise from the second connector 320 is negative, as shown in FIG. 3(h).

The noise from the first connector 310 is present at the second connector 320, as shown in FIG. 3(g). In addition, the second connector 320 generates noise from the crosstalk on the aggressor trace 212 on the victim trace 210, as shown in FIG. 3(h). However, because the noise at the second connector 320 has an inverse polarity with respect to the noise that is present from the first connector 310, the noise from the second connector 320, as shown in FIG. 3(h), substantially cancels the noise from the first connector 310, as shown in FIG. 3(g), so that the total noise from the system 300 is substantially reduced, as shown in FIG. 3(i).

In practice, the total noise from the system 300 shown in FIG. 3(a) is approximately ten percent (10%) of the total noise from the system 100 shown in FIG. 1(a). Accordingly, if the total noise of a system 100 using only straight connections, as shown in FIG. 1(i), is 100 mV, then the total noise in a system 300 with alternating reverse connections, as shown in FIG. 3(i), is approximately 10 mV. And, although each trace pair (e.g., trace pair 213) will aggress the trace pairs on both sides of it (e.g., trace pairs 212 and 214), employing a reverse connection for every other pair will offset the noise on both of those trace pairs (e.g., trace pair 210 will offset trace pair 212 and trace pair 213 will offset trace pair 214).

For the system 300 illustrated in FIG. 3(a), it should be noted that reversing the connection of the aggressor trace pair 330 prior to the first connector 310 will not have the desired noise cancellation effect achieved by the reverse connection of trace pair 212. That is, if the aggressor pair 330 before the first connector 310 is reversed, and the victim trace pairs 332, 210, and 334 are all straight connections, the noise generated at the first and second connectors 310 and 320 will not cancel each other out because the noise will be the same polarity (i.e., negative) at each of the first and second connectors 310 and 320 so that the total noise will be a doubled negative value. Likewise, the reversal of the one or both of the trace pairs 334 and 336 after the second connector 320 will not operate to cancel the noise from the first connector 310.

It should also be noted that the line length of the aggressor trace 212 should substantially match the line length of the victim trace 210 on the backplane 200 in order to attain maximum forward crosstalk cancellation. The tolerance between the lengths matching one another depends on the bit time or the width of the crosstalk pulse. For longer trace lengths, the losses in the trace widens the crosstalk pulse in time. And, because the crosstalk pulse has a larger time window, the tolerance to match the trace lengths between the victim pair and the aggressor pair is relaxed. On long traces, the noise pulse gets very wide in time. It is easier to align two very wide pulses with low amplitude than two narrow pulses with high amplitude.

By way of example, for an aggressor trace length of about 13 inches, the matching trace length of the victim trace must be within about 1 inch, or from 12-14 inches in length. And, for a 10 gb signal, which has 100 picosecond bit time, the signals on the aggressor and victim lines must be within 25 picoseconds of each other. Otherwise, the noise on the first and second connectors 310 and 320 might not fully align with one another and will not cancel each other.

In the embodiment of FIG. 3(a), the input trace pairs 330 and 332 connected to the first connector 310 need not be the same length as each other, and the output trace pairs 334 and 336 connected to the second connector 320 need not be the same length as each other. However, the victim trace pair 210 should be substantially the same length as the aggressor trace pair 212 between the first and second connectors 310 and 320. And, each of the traces 244 and 246 of the aggressor pair 212, as well as the traces 240 and 242 of the victim pair 210, should be approximately the same length. However, it should be noted that the traces of each pair, such as traces 245 and 247, need not be routed near each other and can be routed separate from one another. And, the traces of neighboring pairs need not be routed next to each other. Thus, as shown in FIG. 2 for example, trace 244 cancels trace 242, even though those traces are routed apart from one another.

Although some crosstalk is generated between the traces on the backplane 200, that crosstalk is small compared to the amount of crosstalk that is generated at the connector footprints 220 and 230 and connectors 310 and 320, which is recognized at the vias in the backplane 200. Thus, it is not of particular importance that the traces themselves be physically close to one another, but the physical proximity of the vias to one another in the backplane 200 is of particular importance.

Returning to FIG. 2, the columns (A-J) are offset from one another in an alternating fashion to further reduce noise at the connector footprints 220 and 230. By offsetting the columns in that manner, the positive "+" launch in a succeeding column (e.g., column H, row 2) is moved further from the signal pair launches in the same row of the preceding column (e.g., column G, row 2) so that the signal pair launches in the preceding column couple primarily with the negative "−" launch in the same row of the succeeding column (e.g., column H, row 2). That coupling is illustrated by dashed lines in FIG. 2. And, although the illustrated offset pattern places the positive launch "+" in the succeeding column (e.g., column H, row 2) closer to a negative launch "−" in the preceding row of the preceding column (e.g., column G, row 1), the resulting noise on the negative launch "−" in the preceding row and column causes less total noise in the system 300 than perfectly aligned signal pair launches. The resulting noise on the negative launch "−" of the preceding row and column can be further reduced by inserting a second ground connection between each signal pair launch to create more spacing between rows (not shown).

Although offsetting the columns (A-J) of each footprint 220 and 230 of the backplane 200 reduce the noise aggressed on each signal pair launch by the other, that noise additively increases at each connection made in the system 300. Thus, the noise generated between the launches that connect the second connector 320 to the victim trace pair 210 and aggressor trace pair 212 in the backplane 200 is doubled when added to the noise generated between the launches that connect the second connector 320 to the victim trace pair 336 and aggressor trace pair 334 in the second daughter board. In the backplane 200, the P-N switching of traces cancels the noise generated between the vias in the first and second footprints 220 and 230.

For example, the coupling between the signal pair launch in column G, row 2 and the negative "−" launch in column H, row 2 of the first footprint 220 is cancelled by the coupling between the signal pair launch in column G, row 2 and the negative "−" launch in column H, row 2 of the second footprint 230 because the polarity of the signal pair launch in column G, row 2 of the second footprint 230 is reverse that of the signal pair launch in column G, row 2 of the first footprint 220. That type of noise cancellation, however, is far more difficult for the noise generated between the vias in the backplane 200 and the vias in a daughter card because those connections are not made with traces, but rather with densely configured connectors.

Figure 4:
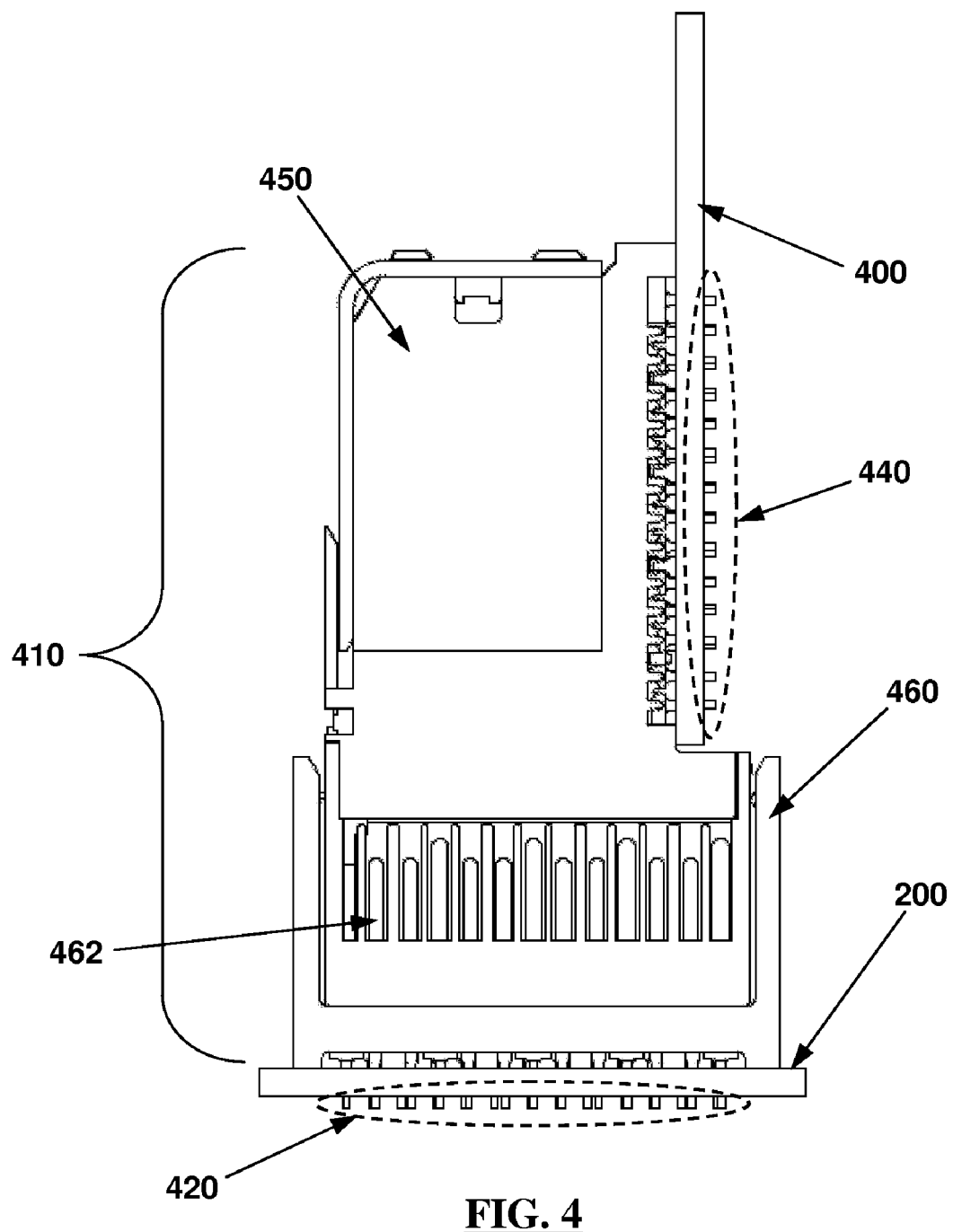
FIG. 4 illustrates an elevation view of a connector connecting a backplane to a daughter card according to a non-limiting embodiment of the present invention.

As FIG. 4 illustrates, the backplane 200 may be connected to a daughter card 400 (representing either the first daughter card or second daughter card discussed above) using a right-angle connector 410. A plurality of first attachment mechanisms 420 extend through the vias of the launches in the backplane 200 and a plurality of second attachment mechanisms 440 extends through the vias of the launches in the daughter card 400. The first and second attachment mechanisms 420 and 440 may be formed as substantially any suitable electrical attachment type, such as surface-mount or compliant pin attachments. Although FIG. 4 illustrates a right-angle connector wherein the daughter card 400 is perpendicular to the backplane 200, a straight connector may also be used wherein the daughter card 400 is parallel to the backplane 200.

Figure 5:
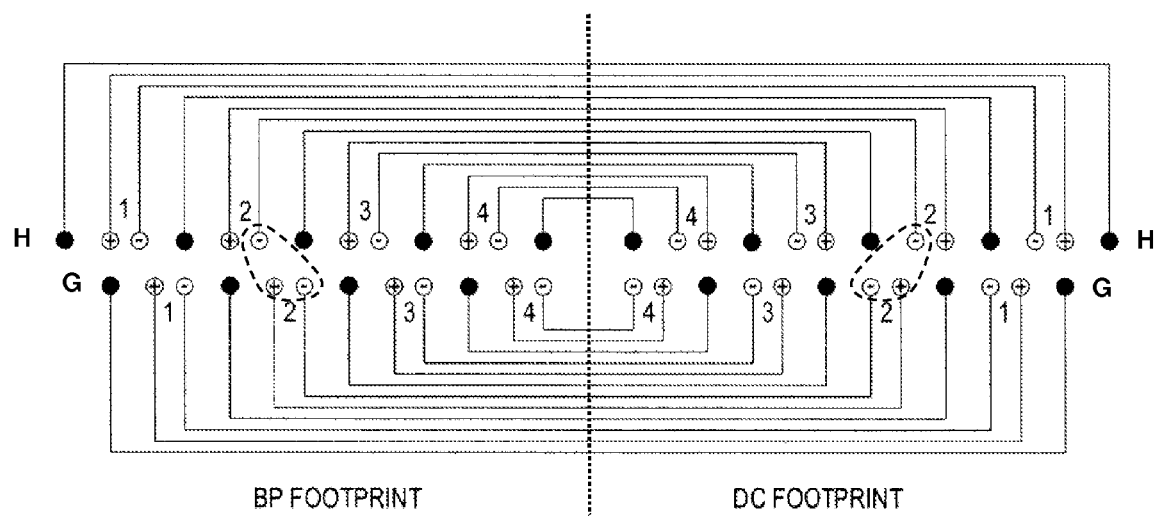
FIG. 5 is a schematic view of the connections made between two columns of launches in a daughter card and two columns of launches in a backplane according to a non-limiting embodiment of the present invention.
Figure 7:
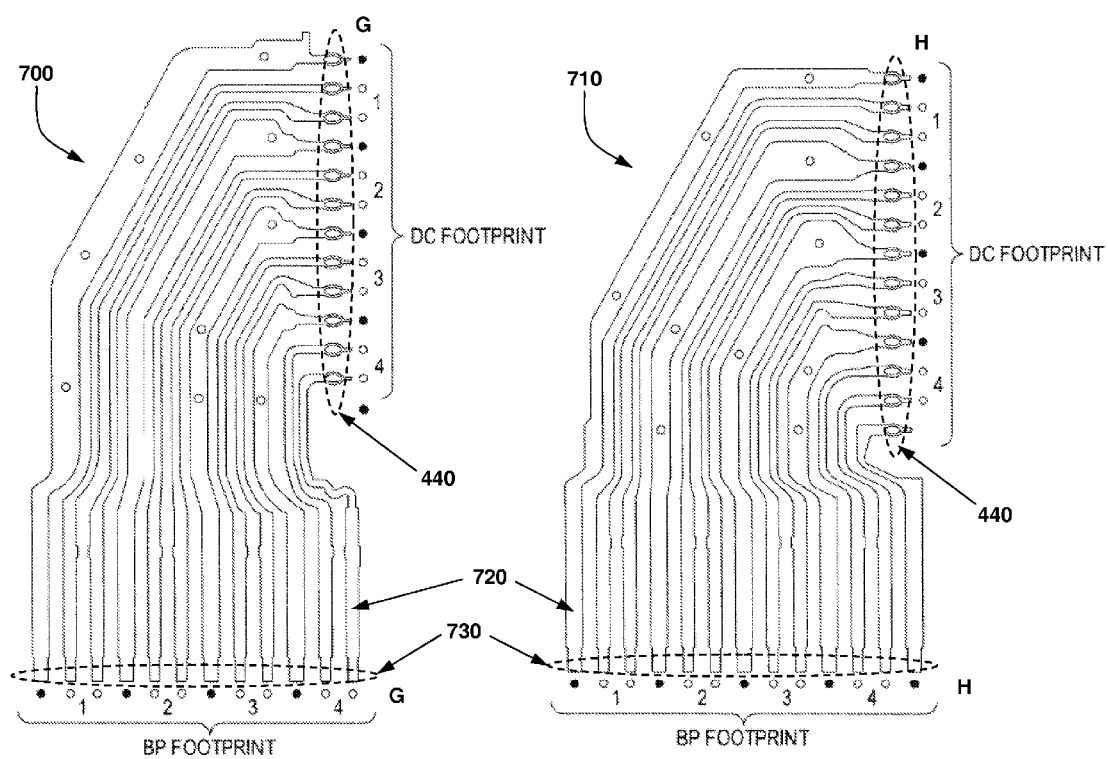
FIG. 7 illustrates an elevation view of two lead frames according to a non-limiting embodiment of the present invention.

As FIG. 5 illustrates, there may be circumstances where noise in the backplane 200 compounds the noise in the daughter card 400. In FIG. 5, the pattern of launches in the connector footprint on the daughter card 400 (hereinafter "the DC Footprint") matches the pattern of launches on the first footprint 220 and/or second footprint 230 on the backplane 200 (hereinafter "the BP Footprint"). The lines extending between the BP Footprint and the DC Footprint represent signal conductors 720 (FIG. 7). And as discussed above, the launches between the differential signal pairs are ground connections, shown in FIG. 5 as blacked-out launches, that are provided between each differential signal pair to create spacing between each differential signal pair so the two launches in each differential signal pair are located closer to each other than to neighboring differential signal pairs, which permits better coupling within the differential signal pairs while reducing crosstalk from adjacent signal pairs.

As a result of the DC Footprint matching BP Footprint, as illustrated in FIG. 5, the same coupling that occurs on the backplane 200 occurs on the daughter card 400. For example, the signal pair launches in column G, row 2 of the BP Footprint couple primarily with the closest signal launch (i.e. the negative "−" launch) in column H, row 2 of the BP Footprint. Similarly, the signal pair launches in column G, row 2 of the DC Footprint couple primarily with the negative "−" launch in column H, row 2 of the DC Footprint. Those couplings are illustrated by dashed lines in FIG. 5. There may also be some coupling (not shown) between the signal pair launches in column G, row 2 and the positive "+" launch in column H, row 3. The coupling that occurs at the BP Footprint is substantially the same as the coupling at the DC Footprint, and the two add together to substantially double the resulting noise in the system 300.

Figure 6:
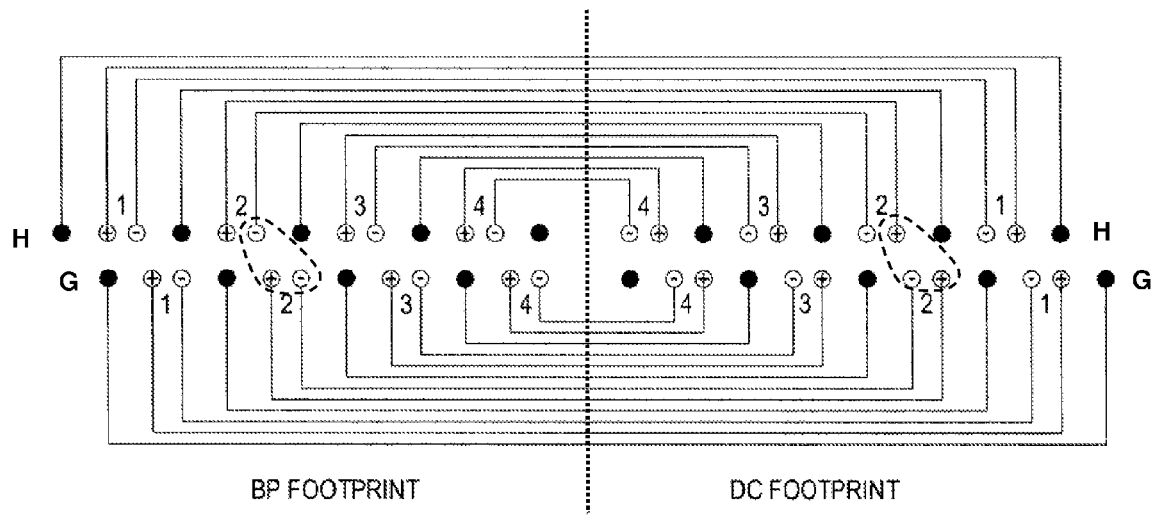
FIG. 6 is a schematic view of the connections made between two columns of launches in a daughter card and two columns of launches in a backplane according to another non-limiting embodiment of the present invention.

To address that noise in the DC Footprint, the present invention provides P-N switching between the DC Footprint and the BP Footprint by reversing the pattern of the DC Footprint with respect to the BP Footprint. As FIG. 6 illustrates, the pattern of launches in the DC Footprint is offset in a reverse configuration from the pattern of launches in the BP Footprint. The signal pair launches in column G, row 2 of the BP Footprint couple primarily with the negative "−" launch in column H, row 2 of the BP Footprint. However, coupling between the signal pair launch in column G, row 2 of the DC Footprint is now with the positive "+" launch in column H, row 2 of the DC Footprint (rather than the negative "−" launch, as illustrated in FIG. 5). The polarity of the launch in column H, row 2 with which the signal pair launch in column G, row 2 is switched from a negative "−" launch in the BP Footprint to a positive "+" launch in the DC Footprint. Thus, the differential signal pair in the BP Footprint couples with a negative "−" launch, whereas the corresponding differential pair in the DC Footprint couples with a positive "+" launch. That P-N reversal acts to cancel (rather than add) the noise caused by the coupling between vias in those footprints. In addition, the signal pair launch in column G, row 2 is closer to the negative "−" launch in column H, row 1 in the DC Footprint while the signal pair launch in column G, row 2 is closer to the positive "+" launch in column H, row 3 in the BP Footprint, which reduces the additive nature of any coupling with the positive "+" launch in column H, row 3 in the DC Footprint to any coupling with the positive "+" launch in the BP Footprint. The coupling described between the differential pair in column G, row 2 and the launches in column H, rows 2 and 3 is substantially similar to that in column G, rows 1, 3, and 4 and the respective launches in column H.

To accommodate the reversed offset patterns on the BP Footprint and the DC Footprint, the connector 410 is formed with at least two different lead frames 700 and 710, as shown in FIG. 7. Each of the lead frames 700 and 710 includes a plurality of signal conductors 720. The signal conductors 720 of the first lead frame 700 are configured to connect the launches in column G of the BP Footprint to the corresponding launches in column G of the DC Footprint. And, the signal conductors 720 of the second lead frame 710 are configured to connect the launches in column H of the BP Footprint to the corresponding launches in column H of the DC Footprint. And, in the DC Footprint, the differential signal pair in column G, row 2 is now closest to the positive "+" launch in column H, row 2 (rather than the negative "−" launch, as illustrated in FIG. 5). Thus, by reversing the pattern of launches on the DC Footprint (rather than reversing the signal conductors 720 within the connector 410) in a similar manner to the traces on the backplane 200, the structure of each of the lead frames 700 and 710 can remain simple and compact.

As illustrated in FIG. 7, each signal conductor 720 includes an attachment mechanism 440 at one end and a mating portion 730 at the other end. Each signal conductor 720 carries electrical signals between the second attachment mechanism 440 and the mating portion 730. Each lead frame 700 and 710 may be formed in an insulated with the attachment mechanisms 440 and a mating portions 730 extending therefrom so as to form individual wafers 450 (FIG. 4). Those wafers 450 may be configured to be ganged together in an alternating fashion between wafers 450 enclosing a first lead frame 700 and wafers enclosing a second lead frame 710 to match the reverse pattern of the BP Footprint and DC Footprint. The wafers 450 may be held together with a carrier strip (not shown) or other convenient mechanism and inserted into a molded housing 460 (FIG. 4) mounted on the backplane 200. In that configuration, shown in FIG. 4, the housing 460 includes the first attachment mechanisms 420, which include conductive members 462 at a distal end of thereof that are adapted to mate with the mating portions 730 of each conductor 720. Such housings 460 are known in the art to facilitate making a large number of simultaneous connections with launches on a PCB.

By using P-N reversals in both the traces of a backplane and between the vias that form the launches in the backplane, the present invention effectively cancels noise generated at the connector footprints and connectors of a connection system. Moreover, the present invention allows for the manufacture of connectors with increased speed and density without degrading the electrical characteristics of the signals they route.

The foregoing description and drawings should be considered as illustrative only of the principles of the invention. The invention may be configured in a variety of manners and is not intended to be limited by the preferred embodiment. Numerous applications of the invention will readily occur to those skilled in the art. For example, though only two connectors 310 and 320 are shown in the illustrative embodiments, additional connectors can be utilized. Preferably, there are an even number of connectors so that the noise at one connector is canceled by the noise at the next or prior connector. In addition, a reverse connection need not be provided for every straight connection. Moreover, although a four signal configuration is illustrated, the backplane and daughter cards may be configured to carry substantially any number of signals in each column of differential signal pairs. Therefore, it is not desired to limit the invention to the specific examples disclosed or the exact construction and operation shown and described. Rather, all suitable modifications and equivalents may be resorted to, falling within the scope of the invention.

What is claimed is:

1. A connector assembly for connecting a first printed circuit board with a second printed circuit board, the connector assembly comprising:
    a first column of differential signal pair contact ends offset from a second column of differential signal pair contact ends so that, for each differential signal pair contact end in the first column of differential signal pair contact ends, the closest differential signal pair contact end in a same row and in the second column of differential signal pair contact ends is of a first polarity;
    a third column of differential signal pair contact ends offset from a fourth column of differential signal pair contact ends so that, for each differential signal pair contact end in the third column of differential signal pair contact ends, the closest differential signal pair contact end in a same row and in the fourth column of differential signal pair contact ends is of a second polarity, opposite the first polarity; and
    conductive elements electrically connecting the first column of differential signal pair contact ends to the third column of differential signal pair contact ends and electrically connecting the second column of differential signal pair contact ends to the fourth column of differential signal pair contact ends,
    wherein the first and second columns of differential signal pair contact ends are configured to connect to first and second columns of differential signal pair launches, respectively, on the first printed circuit board, and
    wherein the third and fourth columns of differential signal pair contact ends are configured to connect to third and fourth columns of differential signal pair launches, respectively, on the second printed circuit board.

2. The connector assembly of claim 1,
    wherein the connector assembly is configured such that noise imparted by a first pair of pair of differential signal pair launches in the first column thereof to a second pair of differential signal pair launches in a same row and in the second column thereof is substantially cancelled by noise imparted by a third pair of differential signal pair launches in the third column thereof to a fourth pair of differential signal pair launches in the same row and in the fourth column thereof when the first pair of differential signal pair launches is electrically connected to the third pair of differential signal pair launches and the second pair of differential signal pair launches is electrically connected to the fourth pair of differential signal pair launches.

3. The connector assembly of claim 1, wherein each column of differential signal pair contact ends includes at least one ground contact end disposed between each pair of differential signal pair contact ends.

4. The connector assembly of claim 3, wherein each column of differential signal pair contact ends includes two ground contact ends disposed between each pair of differential signal pair contact ends.

5. The connector assembly of claim 1, wherein the first printed circuit board is a backplane and the second printed circuit board is a daughter card.

6. The connector assembly of claim 1, wherein the first polarity is positive and the second polarity is negative.

7. An interconnect assembly comprising:
   a first connector assembly according to claim 1;
   a second connector assembly according to claim 1; and
   a printed circuit board having a plurality of signal launches provided as differential pairs and arranged in columns and rows,
   wherein the first and second columns of differential signal pair contact ends of the first connector assembly are connected to first and second columns of differential signal pair launches, respectively, on the printed circuit board, and
   wherein the first and second columns of differential signal pair contact ends of the second connector assembly are connected to third and fourth columns of differential signal pair launches, respectively, on the printed circuit board.

8. The connector interconnect assembly of claim 7, further comprising:
   a plurality of first signal traces connecting each launch in the first column of differential signal pair launches on the first printed circuit board to a corresponding launch in the third column of differential signal pair launches on the first printed circuit board; and
   a plurality of second signal traces connecting each launch in the second column of differential signal pair launches on the first printed circuit board to a corresponding launch in the fourth column of differential signal pair launches on the first printed circuit board,
   wherein a positive signal launch in each pair of differential signal pair launches in the first column of the first printed circuit board is connected by one of the first signal traces to a positive signal launch in a corresponding pair of differential signal pair launches in the third column of the first printed circuit board, and
   wherein a positive signal launch in each pair of differential signal pair launches in the second column of the first printed circuit board is connected by one of the second signal traces to a negative signal launch in a corresponding pair of differential signal pair launches in the fourth column of the first printed circuit board.

9. The interconnection assembly of claim 8,
   wherein a negative signal launch in each pair of differential signal pair launches in the first column of the first printed circuit board is connected by one other of the first signal traces to a negative signal launch in the corresponding pair of differential signal pair launches in the third column of the first printed circuit board, and
   a negative signal launch in each pair of differential signal pair launches in the second column of the first printed circuit board is connected by one other of the second signal traces to a positive signal launch in the corresponding pair of differential signal pair launches in the fourth column of the first printed circuit board.

10. The connector assembly of claim 1, wherein each of the conductive elements comprises:
    a signal conductor having a first end with a differential signal pair contact end disposed thereon, and a second end forming a mating portion; and
    a conductive member having a first end with a differential signal pair contact end disposed thereon, and a second end,
    wherein the second end of the conductive member is adapted to mate with the mating portion of the signal conductor.

11. The connector assembly of claim 10 further comprising:
    an insulative housing having the conductive members disposed therein, the differential signal pair contact ends of the conductive members forming the first and second columns of differential signal pair contact ends;
    a first wafer having first signal conductors disposed therein, the differential signal pair contact ends of the first signal conductors forming the third column of differential signal pair contact ends; and
    a second wafer having second signal conductors disposed therein, the differential signal pair contact ends of the second signal conductors forming the fourth column of differential signal pair contact ends,
    wherein the first and second wafers are configured to be inserted into the insulative housing.

12. A method for connecting a first printed circuit board with a second printed circuit board, the method comprising the steps of:
    providing a first column of differential signal pair launches offset from a second column of differential signal pair launches on the first printed circuit board so that each differential signal pair launch in the first column is closest to a launch of a first polarity in a differential signal pair in a same row and in the second column on the first printed circuit board;
    providing a third column of differential signal pair launches offset from a fourth column of differential signal pair launches on the second printed circuit board so that each differential signal pair launch in the third column is closest to a launch of a second polarity, opposite the first polarity, in a differential signal pair in the same row and in the fourth column on the second printed circuit board;
    electrically connecting the first column of differential signal pair launches on the first printed circuit board to the third column of differential signal pair launches on the second printed circuit board; and
    electrically connecting the second column of differential signal pair launches on the first printed circuit board to the fourth column of differential signal pair launches on the second printed circuit board.

13. The method of claim 12, wherein the first and second printed circuit boards are connected such that noise imparted by a first pair of differential signal pair launches in the first column to a second pair of differential signal pair launches in the same row and in the second column is substantially cancelled by noise imparted by a third pair of differential signal pair launches in the third column to a fourth pair of differential signal pair launches in the same row and in the fourth column.

14. The method of claim 12, wherein each column of differential signal pair launches is provided with at least one ground connection launch disposed between each pair of differential signal pair launches.

15. The method of claim 14, wherein each column of differential signal pair launches is provided with two ground connection launches disposed between each pair of differential signal pair launches.

16. The method of claim 12, wherein the first printed circuit board is a backplane and the second printed circuit board is a daughter card.

17. The method of claim 12, wherein the first polarity is positive and the second polarity is negative.

18. The method of claim 12, further comprising the steps of:
providing a fifth column of differential signal pair launches offset from a sixth column of differential signal pair launches on the first printed circuit board so that each differential signal pair launch in the fifth column is closer to a launch of the first polarity in a signal pair in a same row and in the sixth column on the first printed circuit board;
providing a seventh column of differential signal pair launches offset from an eighth column of differential signal pair launches on the second printed circuit board so that each differential signal pair launch in the seventh column is closer to a launch of the second polarity, opposite the first polarity, in a differential signal pair in the same row and in the eighth column on the second printed circuit board;
electrically connecting the fifth column of differential signal pair launches on the first printed circuit board to the seventh column of differential signal pair launches on the second printed circuit board; and
electrically connecting the sixth column of differential signal pair launches on the first printed circuit board to the eighth column of differential signal pair launches on the second printed circuit board.

19. The method of claim 18, further comprising the steps of:
providing a plurality of first signal traces connecting each launch in the first column of differential signal pair launches on the first printed circuit board to a corresponding launch in the fifth column of differential signal pair launches on the first printed circuit board; and
providing a plurality of second signal traces connecting each launch in the second column of differential signal pair launches on the first printed circuit board to a corresponding launch in the sixth column of differential signal pair launches on the first printed circuit board,
wherein a positive signal launch in each pair of differential signal pair launches in the first column of the first printed circuit board is connected by one of the first signal traces to a positive signal launch in a corresponding pair of differential signal pair launches in the fifth column of the first printed circuit board, and
wherein a positive signal launch in each pair of differential signal pair launches in the second column of the first printed circuit board is connected by one of the second signal traces to a negative signal launch in a corresponding pair of differential signal pair launches in the sixth column of the first printed circuit board.

20. The method of claim 19,
wherein a negative signal launch in each pair of differential signal pair launches in the first column of the first printed circuit board is connected by one other of the first signal traces to a negative signal launch in the corresponding pair of differential signal pair launches in the fifth column of the first printed circuit board, and
wherein a negative signal launch in each pair of differential signal pair launches in the second column of the first printed circuit board is connected by one other of the second signal traces to a positive signal launch in the corresponding pair of differential signal pair launches in the sixth column of the first printed circuit board.

21. A connector assembly for connecting a first printed circuit board with a second printed circuit board, the connector assembly comprising:
an insulative housing having adjacent first and second columns of conductive members arranged as differential signal pairs disposed therein, each conductive member having a first end with a contact end disposed thereon and a second end;
a first wafer having first signal conductors arranged as differential signal pairs disposed therein, each first signal conductor having a first end with a contact end disposed thereon and a second end forming a mating portion; and
a second wafer having second signal conductors arranged as differential signal pairs disposed therein, each second signal conductor having a first end with a contact end disposed thereon and a second end forming a mating portion,
wherein the first and second wafers are configured to be inserted into the insulative housing such that the second ends of the first and second columns of conductive members mate with the mating portions of the first and second signal conductors, respectively,
wherein the conductive members are arranged such that, for the contact end of each conductive member in the first column, the closest contact end of an adjacent differential signal pair of contact elements in the second column is of a first polarity,
and wherein the first and second signal conductors are arranged such that, for the contact end of each first signal conductor, the closest contact end of an adjacent differential signal pair of second signal conductors is of a second polarity, opposite the first polarity.

22. The connector assembly of claim 21,
wherein the contact ends of the first and second columns of conductive members are configured to mate with first and second columns of differential signal pair launches, respectively, on a first printed circuit board,
wherein the contact ends of the first and second signal conductors are configured to mate with third and fourth columns of differential signal pair launches, respectively, on a second printed circuit board, and
wherein noise imparted by a first pair of differential signal pair launches in the first column thereof to an adjacent second pair of differential signal pair launches in the second column thereof is substantially canceled by noise imparted by a third pair of differential signal pair launches in the third column thereof to an adjacent fourth pair of differential signal pair launches in the fourth column thereof when the first pair of differential signal pair launches is electrically connected to the third pair of differential signal pair launches and the second pair of differential signal pair launches is electrically connected to the fourth pair of differential signal pair launches.

23. The connector assembly of claim 21,
wherein adjacent differential signal pairs of conductive members in each column have at least one ground conductive member disposed therebetween,
wherein adjacent differential signal pairs of first signal conductors have at least one ground conductor disposed therebetween, and
wherein adjacent differential signal pairs of second signal conductors have at least one ground conductor disposed therebetween.

* * * * *